United States Patent
Wu et al.

(10) Patent No.: US 8,921,933 B2
(45) Date of Patent: Dec. 30, 2014

(54) SEMICONDUCTOR STRUCTURE AND METHOD FOR OPERATING THE SAME

(75) Inventors: Shyi-Yuan Wu, Hsin-Chu (TW);
Wing-Chor Chan, Hsinchu (TW);
Shih-Chin Lien, New Taipei (TW);
Cheng-Chi Lin, Yilan County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/111,018

(22) Filed: May 19, 2011

(65) Prior Publication Data
US 2012/0292689 A1    Nov. 22, 2012

(51) Int. Cl.

| | | |
|---|---|---|
| *H01L 29/66* | (2006.01) | |
| *H01L 29/78* | (2006.01) | |
| *H01L 29/739* | (2006.01) | |
| *H01L 29/06* | (2006.01) | |
| *H01L 29/08* | (2006.01) | |
| *H01L 29/423* | (2006.01) | |

(52) U.S. Cl.
CPC ........ *H01L 29/7824* (2013.01); *H01L 29/7825* (2013.01); *H01L 29/7816* (2013.01); *H01L 29/7397* (2013.01); *H01L 29/7809* (2013.01); *H01L 29/7813* (2013.01); *H01L 29/7817* (2013.01); *H01L 29/7831* (2013.01); *H01L 29/7835* (2013.01); *H01L 29/0634* (2013.01); *H01L 29/0653* (2013.01); *H01L 29/0692* (2013.01); *H01L 29/0696* (2013.01); *H01L 29/0878* (2013.01); *H01L 29/42368* (2013.01)
USPC ........... 257/335; 257/330; 257/327; 257/342; 257/343

(58) Field of Classification Search
CPC . H01L 29/0696; H01L 29/0878; H01L 29/06; H01L 29/66659; H01L 29/7831; H01L 29/7816; H01L 29/7825; H01L 29/7823; H01L 29/7824; H01L 29/7397; H01L 29/7835; H01L 29/0653; H01L 29/42368
USPC ......... 257/330, 327, 341, 342, 343, 492, 493, 257/335
See application file for complete search history.

(56) References Cited

U.S. PATENT DOCUMENTS 7,002,211 B2 * 2/2006 Onishi et al. .................. 257/342
7,064,385 B2 * 6/2006 Dudek et al. .................. 257/335

(Continued)

FOREIGN PATENT DOCUMENTS

TW    201015719 A1    4/2010

OTHER PUBLICATIONS

TW Office Action dated Aug. 28, 2013.

*Primary Examiner* — Fernando L Toledo
*Assistant Examiner* — Aaron Gray
(74) *Attorney, Agent, or Firm* — McClure, Qualey & Rodack, LLP

(57) ABSTRACT

A semiconductor structure and a method for operating the same are provided. The semiconductor structure includes a substrate, a first doped region, a second doped region, a third doped region, a first trench structure and a second gate structure. The first doped region is in the substrate. The first doped region has a first conductivity type. The second doped region is in the first doped region. The second doped region has a second conductivity type opposite to the first conductivity type. The third doped region having the first conductivity type is in the second doped region. The first trench structure has a first gate structure. The first gate structure and the second gate structure are respectively on different sides of the second doped region.

14 Claims, 22 Drawing Sheets

(56) References Cited

U.S. PATENT DOCUMENTS

| | | |
|---|---|---|
| 7,355,224 B2 | 4/2008 | Cai |
| 7,535,057 B2 * | 5/2009 | Yang ............................ 257/335 |
| 2004/0065919 A1 * | 4/2004 | Wilson et al. ................. 257/329 |
| 2004/0173846 A1 | 9/2004 | Hergenrother et al. |
| 2005/0082603 A1 * | 4/2005 | Fujii ............................. 257/328 |
| 2010/0078715 A1 * | 4/2010 | Lee ............................... 257/330 |
| 2011/0127602 A1 * | 6/2011 | Mallikarjunaswamy ..... 257/331 |

* cited by examiner

330

454 458

SEMICONDUCTOR STRUCTURE AND METHOD FOR OPERATING THE SAME

BACKGROUND

1. Technical Field

The disclosure relates in general to a semiconductor structure and an operating method for the same, and more particularly to a semiconductor structure and an operating method for the same for improving both a breakdown voltage and an on-state resistance (on-state current).

2. Description of the Related Art

In a semiconductor technique, for example, a semiconductor structure such as power device uses LDMOS and RESURF techniques compatible with existing CMOS processes. A method for increasing a breakdown voltage (BVdss) of the semiconductor structure is decreasing a dopant concentration of a drain region and increasing a drift length. However, an on-state resistance of the semiconductor structure is increased due to the method. In addition, a big design area is need.

SUMMARY

A semiconductor structure is provided. The semiconductor structure comprises a substrate, a first doped region, a second doped region, a third doped region, a first trench structure and a second gate structure. The first doped region is in the substrate. The first doped region has a first conductivity type. The second doped region is in the first doped region. The second doped region has a second conductivity type opposite to the first conductivity type. The third doped region having the first conductivity type is in the second doped region. The first gate structure and the second gate structure are respectively on different sides of the second doped region A method for operating a semiconductor structure is provided. The semiconductor structure comprises a substrate, a first doped region, a second doped region, a third doped region, a first trench structure and a second gate structure. The first doped region is in the substrate. The first doped region has a first conductivity type. The second doped region is in the first doped region. The second doped region has a second conductivity type opposite to the first conductivity type. The third doped region having the first conductivity type is in the second doped region. The first trench structure has a first gate structure. The first gate structure and the second gate structure are respectively on different sides of the second doped region. The method for operating the semiconductor structure comprises following steps. A first bias is applied between the third doped region and the first doped region respectively on opposite sides of the second gate structure. A second bias is applied to the first gate structure and applying a third bias to the second gate structure to controlling the semiconductor to be in on-state or off-state. As the semiconductor structure is in on-state, a current flows through a channel at least comprising a first channel and a second channel. The first channel comprises a portion of the second doped region adjacent to the first gate structure. The second channel comprises a portion of the second doped region adjacent to the second gate structure.

DETAILED DESCRIPTION

In embodiments, the semiconductor structure comprises an IGBT, a diode or a MOS such as LDMOS or EDMOS.

Figure 1:
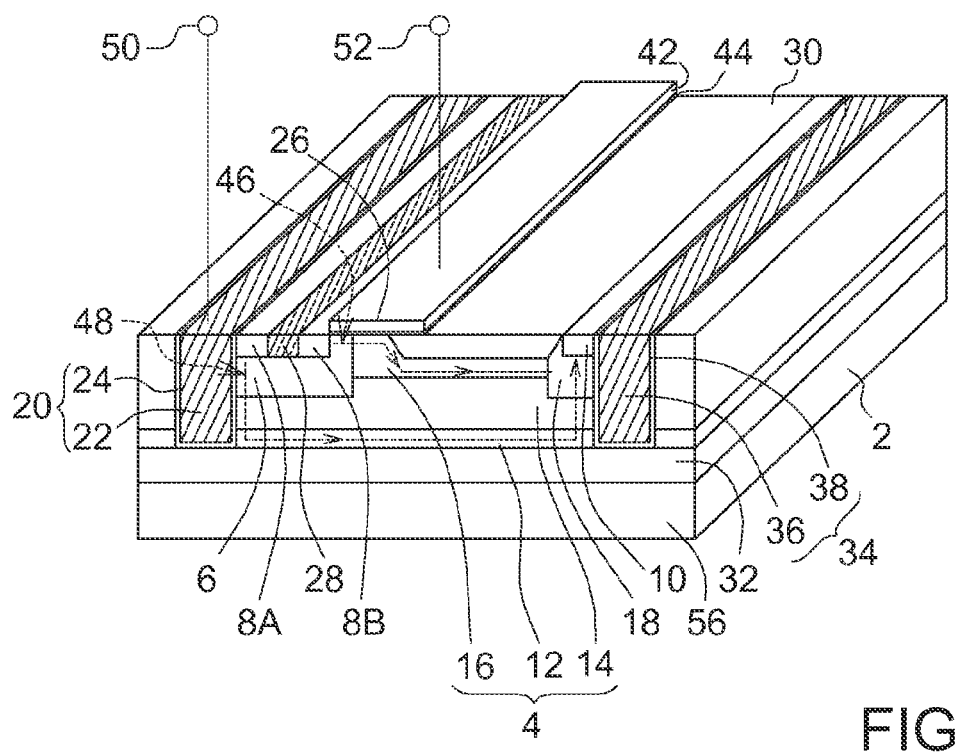
FIG. 1 shows a stereoscopic view of the semiconductor structure in one embodiment.
Figure 2:
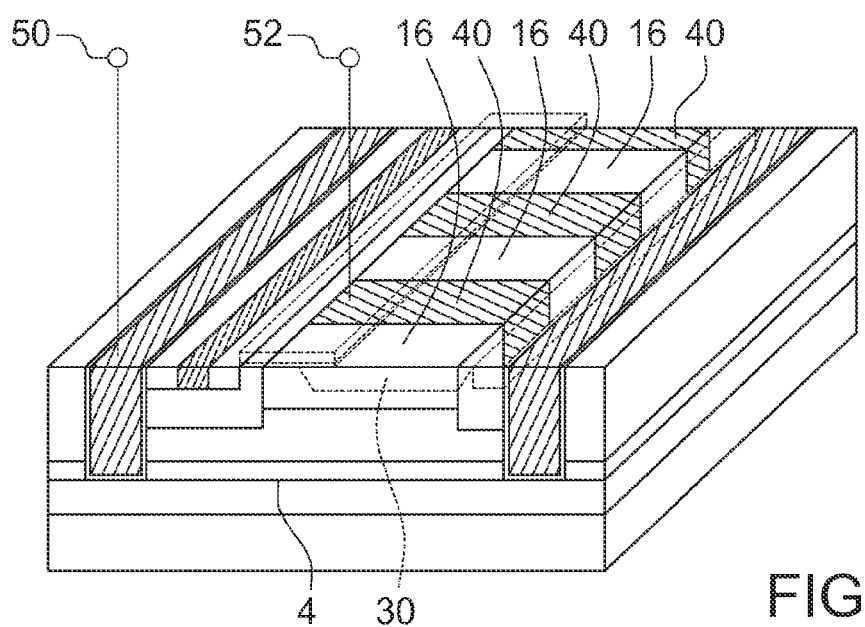
FIG. 2 shows a stereoscopic view of the semiconductor structure in one embodiment.

FIG. 1 and FIG. 2 show stereoscopic views of the semiconductor structure in one embodiment. Referring to FIG. 1, the semiconductor structure comprises a substrate 2. A first doped region 4 is in the substrate 2. The substrate 2 may comprise SOI for saving the design area and decreasing the on-state resistance. The first doped region 4 comprises a sub-doped layer 12, a sub-doped layer 14 and a sub-doped layer 16. A second doped region 6 is in the first doped region 4. A third doped region 8A and a third doped region 8B are in the second doped region 6. A well region 18 is in the first doped region 4. A fourth doped region 10 is in the well region 18. The well region 18 and the second doped region 6 are separated by the first doped region 4. A fifth doped region 28 is in the second doped region 6. A buried dielectric layer 32 is between the first doped region 4 and a bottom layer 56. The buried dielectric layer 32 comprises oxide. The third doped region 8A, the third doped region 8B, the fifth doped region 28, the fourth doped region 10 and the sub-doped layer 12 are heavily doped.

In some embodiments, the semiconductor structure shown in FIG. 1 and FIG. 2 comprises LDMOS or EDMOS. The first doped region 4 (comprising the sub-doped layer 12, the sub-doped layer 14 and the sub-doped layer 16), the well region 18, the fourth doped region 10, the third doped region 8A and the third doped region 8B have a first conductivity type such as N conductivity type. The bottom layer 56, the second doped region 6 and the fifth doped region 28 have a second conductivity type, such as P conductivity type, opposite to the first conductivity type.

In some embodiments, the semiconductor structure shown in FIG. 1 and FIG. 2 comprises IGBT. The first doped region 4 (comprising the sub-doped layer 12, the sub-doped layer 14 and the sub-doped layer 16), the third doped region 8A and the third doped region 8B have the first conductivity type such as N conductivity type. The bottom layer 56, the second doped region 6, the fifth doped region 28, the well region 18 and the fourth doped region 10 have the second conductivity type, such as P conductivity type opposite to the first conductivity type.

In other embodiments, for example, the first conductivity type is P conductivity type, and the second conductivity type is N conductivity type. The third doped region 8A and the third doped region 8B are used as a source. The fourth doped region 10 is used as a drain.

A first trench structure having a first gate structure 20 is in substrate 2. A second trench structure 34 is also in the substrate 2. The first gate structure 20 comprises a gate electrode layer 22 and a gate dielectric layer 24 on the gate electrode layer 22. The gate electrode layer 22 comprises polysilicon, metal or silicide. The second trench structure 34 comprises a conductive element 36 and a dielectric element 38 formed on the conductive element 36. The conductive element 36 comprises polysilicon, metal or silicide. A dielectric structure 30 is on the first doped region 4. The dielectric structure 30 comprises STI. The second trench structure 34 of a deep trench can provide isolation effect from other devices, and therefore the breakdown voltage of the semiconductor structure can be sustained at a high voltage. A depth or height of the second trench structure 34 and the first trench structure having the first gate structure 20 can be adjusted according to demand. The first gate structure 20 and the second gate structure 26 are respectively on different sides of the second doped region 6. The second gate structure 26 is also extended on the dielectric structure 30. The second gate structure 26 comprises a gate dielectric layer 44 and a gate electrode layer 42 on the gate dielectric layer 44. The gate electrode layer 42 comprises polysilicon, metal or silicide.

For illustrating the super junction structure concept in embodiments, some elements as shown in FIG. 1 are shown in perspective view in FIG. 2. Referring to FIG. 2, the semiconductor structure comprises sixth doped regions 40 separated from each other by the sub-doped layer 16 of the first doped region 4. The sixth doped regions 40 have the second conductivity type such as P conductivity type. For example, the sixth doped regions 40 and the sub-doped layer 16 of the first doped region 4 are formed by filling a polysilicon material in a trench. In embodiments, the sixth doped regions 40 and the sub-doped layer 16 of the first doped region 4 form a super junction structure. The breakdown voltage (BVdss) and the on-state resistance can both be improved by using the super junction structure. The sixth doped regions 40 and the first doped region 4 for forming the super junction structure are not limited to a strip shape (rectangular shape), and may comprise a hexagonal shape, octagonal shape or circle shape.

In embodiments, referring to FIG. 1, the semiconductor structure is operated by a method comprising following steps. A bias is applied between the third doped region 8A and the fourth doped region 10. Optionally, a bias is applied between the third doped region 8B and the fourth doped region. The first channel 48 adjacent to the first gate structure 20 is controlled to be in on-state or off-state by applying the bias 50 to the first gate structure 20. The second gate structure 26 adjacent to the second gate structure 26 is controlled to be in on-state or off-state by applying the bias 52 to the second gate structure 26. The bias 50 and the bias 52 may be controlled in independently or together. The bias 50 may be as same as or different from the bias 52. In embodiments, for example, as the semiconductor structure is in on-state, a current flows from the third doped region 8B, through the second channel 46, the sub-doped layer 16 of the first doped region 4, and the well region 18, to the fourth doped region 10. The current also flows from the third doped region 8A, through the first channel 48, the sub-doped layer 14 and the sub-doped layer 12 of the first doped region 4 and the well region 18, to the fourth doped region 10. Therefore, the semiconductor structure using the dual-gate concept has a high on-state current and a low on-state resistance (Rdson). Using the sub-doped layer 12 which is heavily doped helps improvement of high on-state current low on-state resistance.

In embodiments, the super junction concept and the dual-gate concept are combined in the semiconductor structure. Therefore, the breakdown voltage and the on-state resistance (on-state current) are both improved at the same time. For example, the semiconductor structure can sustain a high voltage such as 1200V.

Figure 3:
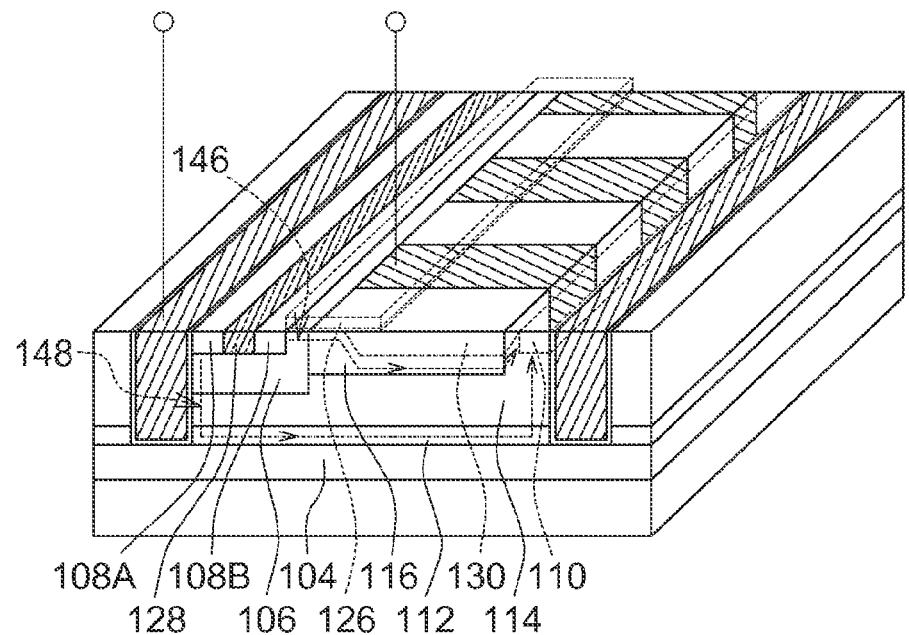
FIG. 3 shows a stereoscopic view of the semiconductor structure in one embodiment.

FIG. 3 shows a stereoscopic view of the semiconductor structure in one embodiment. Some elements in FIG. 3 are shown perspectively. The semiconductor structure shown in FIG. 3 differs from the semiconductor structure shown in FIG. 1 and FIG. 2 in that the well region 18 as shown in FIG. 1 and FIG. 2 is omitted. In one embodiment, for example, the semiconductor structure shown in FIG. 3 comprises IGBT. The first doped region 104, the third doped region 108A and the third doped region 108B have the first conductivity type such N conductivity type. The second doped region 106, the fifth doped region 128 and the fourth doped region 110 have the second conductivity type such as P conductivity type opposite to the first conductivity type. In embodiments, for example, as the semiconductor structure is in on-state, a current flows from the third doped region 108B, through the second channel 146 and the sub-doped layer 116 of the first doped region 104, to the fourth doped region 110. The current also flows from the third doped region 108A, through the first channel 148, the sub-doped layer 114 and the sub-doped layer 112 of the first doped region, to the fourth doped region 110.

Figure 4:
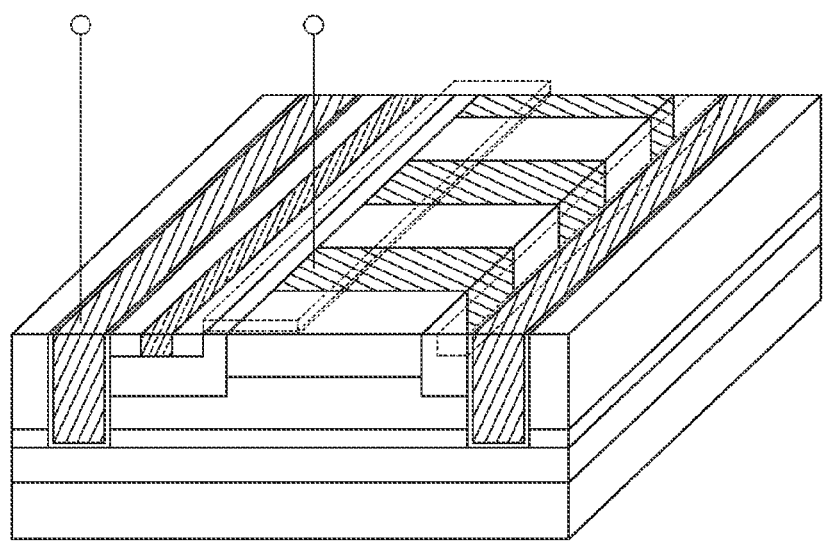
FIG. 4 shows a stereoscopic view of the semiconductor structure in one embodiment.

FIG. 4 shows a stereoscopic view of the semiconductor structure in one embodiment. Some elements in FIG. 4 are shown perspectively. The semiconductor structure shown in FIG. 4 differs from the semiconductor structure shown in FIG. 1 and FIG. 2 in that the dielectric structure 30 as shown in FIG. 1 and FIG. 2 is omitted.

Figure 5:
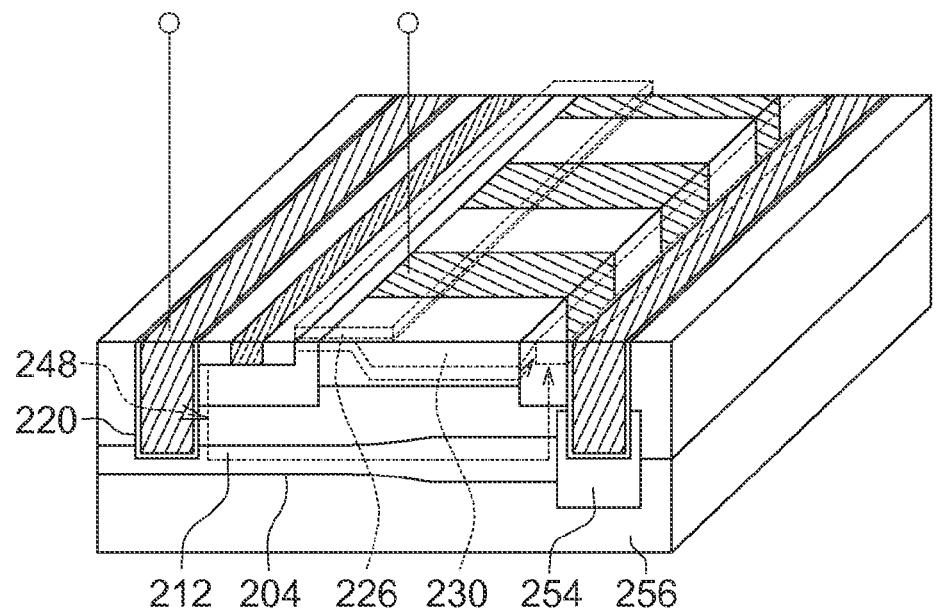
FIG. 5 shows a stereoscopic view of the semiconductor structure in one embodiment.

FIG. 5 shows a stereoscopic view of the semiconductor structure in one embodiment. Some elements in FIG. 5 are shown perspectively. The semiconductor structure shown in FIG. 5 differs from the semiconductor structure shown in FIG. 1 and FIG. 2 in that the buried dielectric layer 32 as shown in FIG. 1 and FIG. 2 is omitted. A dopant concentration of a portion of the sub-doped layer 212, used as a buried doped layer, of the first doped region 204 adjacent to the first trench structure having the first gate structure 220 is smaller than a dopant concentration of a portion of the sub-doped layer 212 far from the first trench structure. The conductivity efficiency of the current flowing the long path comprising the first channel 248 is improved by this design, increasing the on-state current and decreasing the on-state resistance of the semiconductor structure. After an annealing step, a profile height of a portion of the sub-doped layer 212 adjacent to the first trench structure is smaller than a profile height of a portion of the sub-doped layer 212 far from the first trench structure, as shown in FIG. 5, due to the difference of the dopant concentration. A doped region 254 is in the bottom layer 256. The doped region 254 and the bottom layer 256 have the same conductivity type such as P conductivity type, opposite to the conductivity type, such as N conductivity type, of the first doped region 204.

Figure 6:
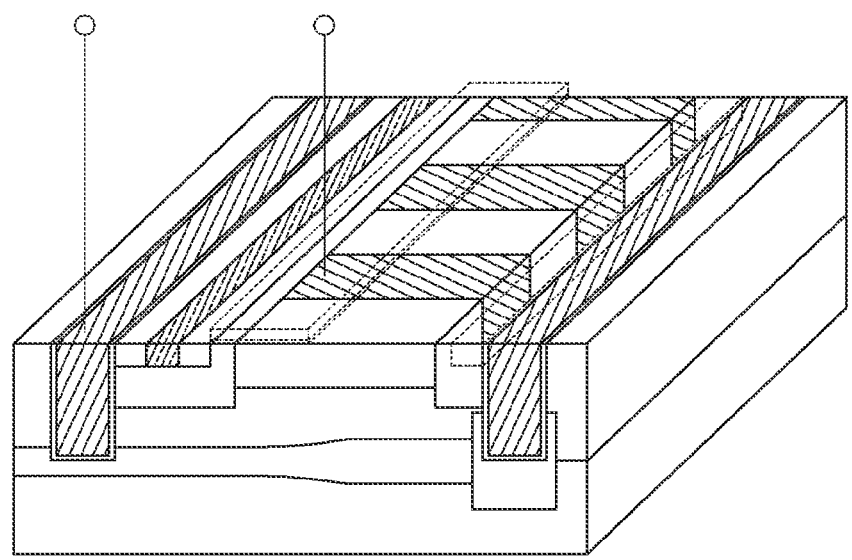
FIG. 6 shows a stereoscopic view of the semiconductor structure in one embodiment.

FIG. 6 shows a stereoscopic view of the semiconductor structure in one embodiment. The semiconductor structure shown in FIG. 6 differs from the semiconductor structure shown in FIG. 5 in that the dielectric structure 230 as shown in FIG. 5 is omitted.

Figure 7:
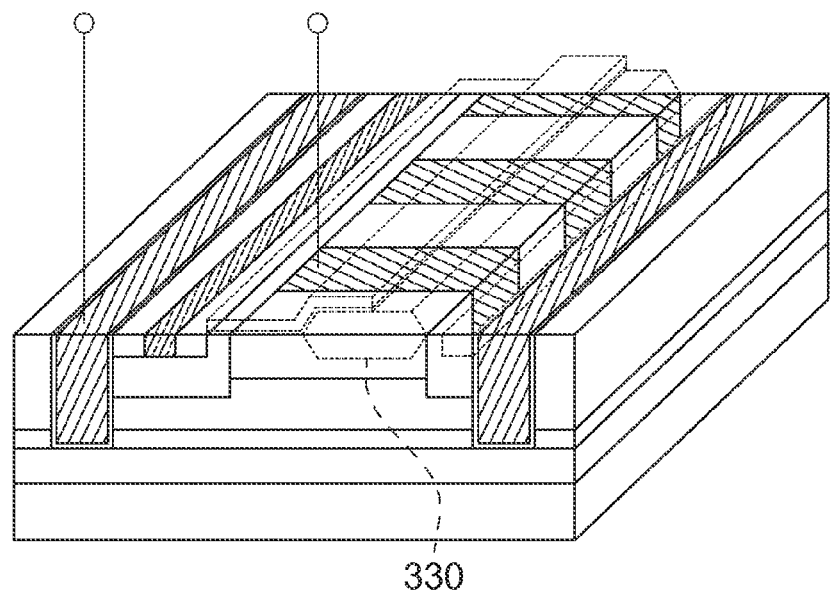
FIG. 7 shows a stereoscopic view of the semiconductor structure in one embodiment.

FIG. 7 shows a stereoscopic view of the semiconductor structure in one embodiment. The semiconductor structure shown in FIG. 7 differs from the semiconductor structure shown in FIG. 1 and FIG. 2 in that the dielectric structure 330 is FOX.

Figure 8:
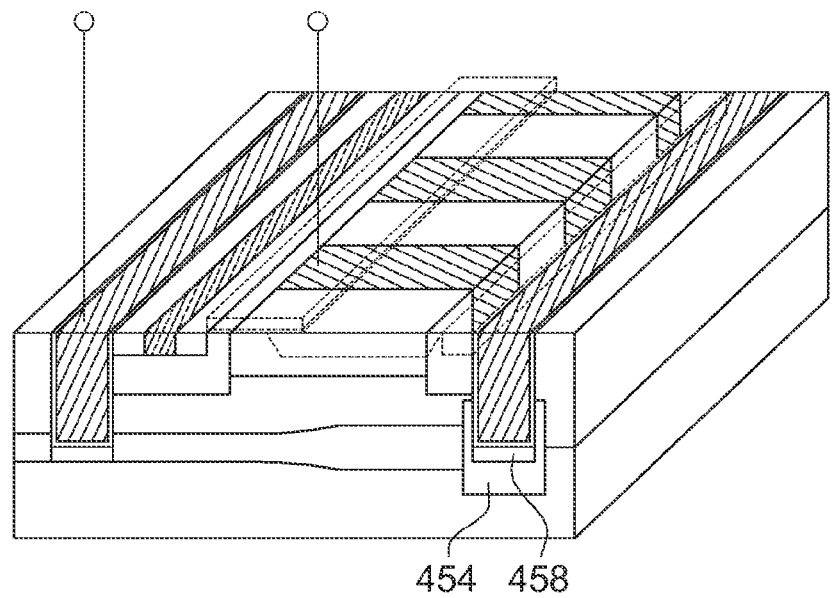
FIG. 8 shows a stereoscopic view of the semiconductor structure in one embodiment.

FIG. 8 shows a stereoscopic view of the semiconductor structure in one embodiment. The semiconductor structure shown in FIG. 8 differs from the semiconductor structure shown in FIG. 5 in that a doped region 458 is formed in a doped region 454. The doped region 458 and the doped region 454 have the same conductivity type such as P conductivity type.

Figure 9:
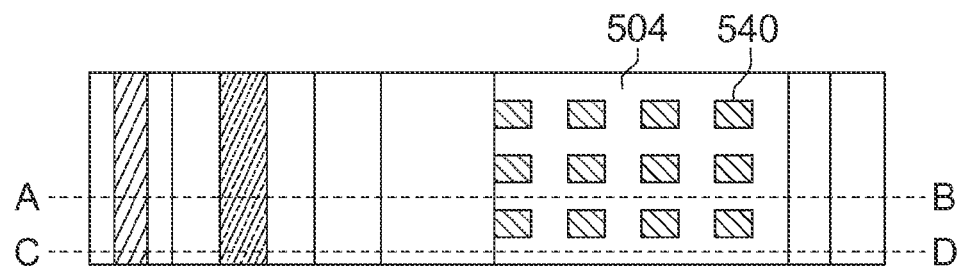
FIG. 9 shows a top view of the semiconductor structure in one embodiment.
Figure 10:
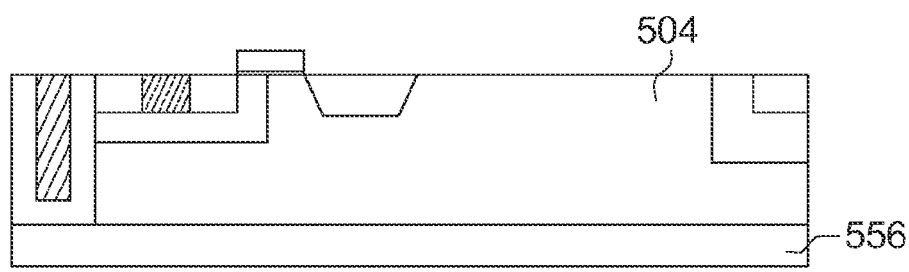
FIG. 10 shows a cross-section view of the semiconductor structure in one embodiment.
Figure 11:
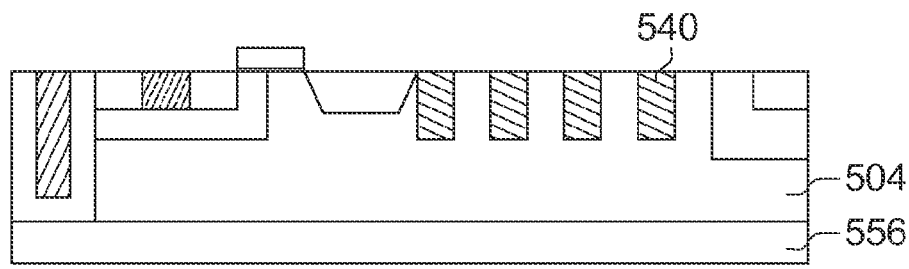
FIG. 11 shows a cross-section view of the semiconductor structure in one embodiment.

FIG. 9 shows a top view of the semiconductor structure in one embodiment. FIG. 10 and FIG. 11 are cross-section views of the semiconductor structure drawn respectively along AB line and CD line in FIG. 9. Referring to FIG. 9, the sixth doped regions 540 are separated from each other by the first doped region 504. The sixth doped region 540 has rectangular shape. The shape of the sixth doped regions 540 is not limited to rectangular shape as shown in FIG. 9, and may comprise hexagonal shape, octagonal shape or circle shape. The semiconductor structure is a MOS such as LDMOS uses super junction concept and dual-gate concept. For example, the sixth doped region 540 is formed by filling a trench with polysilicon. Referring to FIG. 10 and FIG. 11, the bottom layer 556 may be a doped layer or an epitaxial layer.

Figure 12:
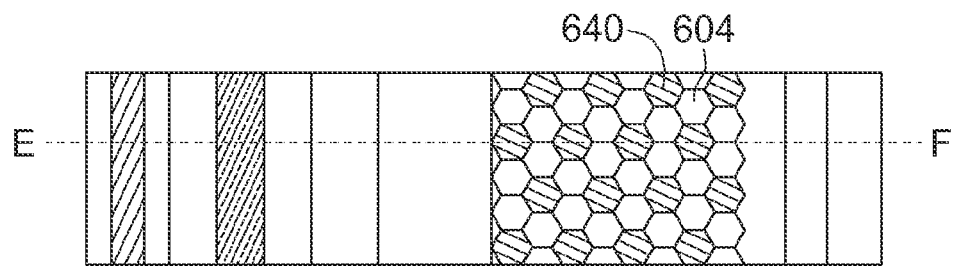
FIG. 12 shows a top view of the semiconductor structure in one embodiment.
Figure 13:
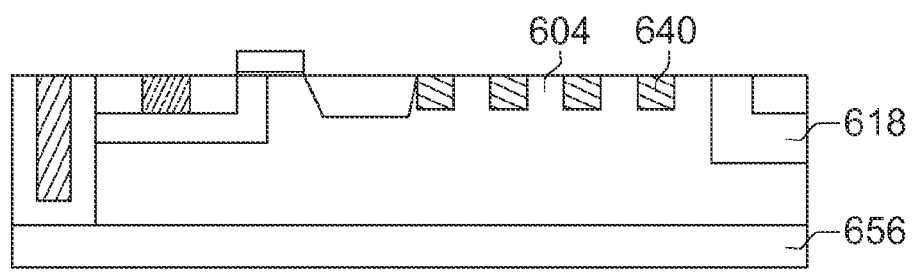
FIG. 13 shows a cross-section view of the semiconductor structure in one embodiment.

FIG. 12 shows a top view of the semiconductor structure in one embodiment. FIG. 13 is a cross-section view of the semiconductor structure drawn along EF line in FIG. 12. Referring to FIG. 12, the sixth doped regions 640 and the first doped regions 604 of honeycomb shape are arranged in stagger. The sixth doped regions 640 and the first doped regions 604 form a super junction structure. The shape of the sixth doped region 640 and the first doped region 604 forming the super junction structure is not limited to hexagonal shape as shown in FIG. 12, and may comprise rectangular shape, octagonal shape or circle shape. The semiconductor structure is a MOS such as LDMOS uses super junction concept and dual-gate concept. For example, the sixth doped region 640 and the first doped region 604 forming the super junction structure are respectively formed by filling a polysilicon material in a trench. Referring to FIG. 13, the bottom layer 656 may be a doped layer or an epitaxial layer.

Figure 14:
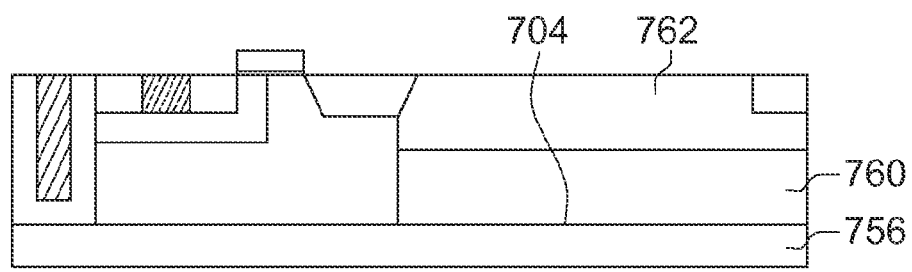
FIG. 14 shows a cross-section view of the semiconductor structure in one embodiment.

FIG. 14 shows a cross-section view of the semiconductor structure in one embodiment. Referring to FIG. 14, the first doped region 704 comprises a buffer region 760 having the same conductivity type with the first doped region 704 and being between the bottom layer 756 and the super junction structure 762. The well region 618 as shown in FIG. 13 is omitted in the semiconductor structure shown in FIG. 14.

Figure 15:
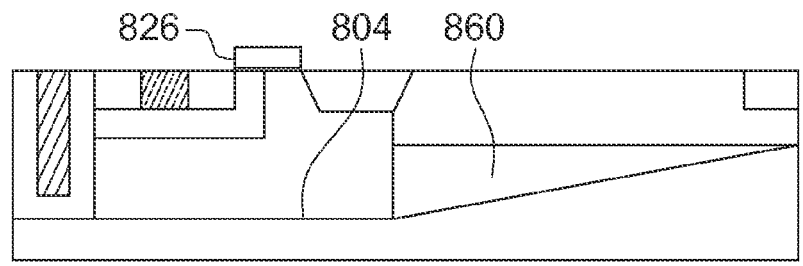
FIG. 15 shows a cross-section view of the semiconductor structure in one embodiment.

The semiconductor structure shown in FIG. 15 differs from the semiconductor structure shown in FIG. 14 in that a height of a portion of the buffer region 860 of the first doped region 804 adjacent to the second gate structure 826 is bigger than a height of a portion of the buffer region 860 far from the second gate structure 826. Particularly, the height of the buffer region 860 of the first doped region 804 becomes small in a direction away from the second gate structure 826.

Figure 16:
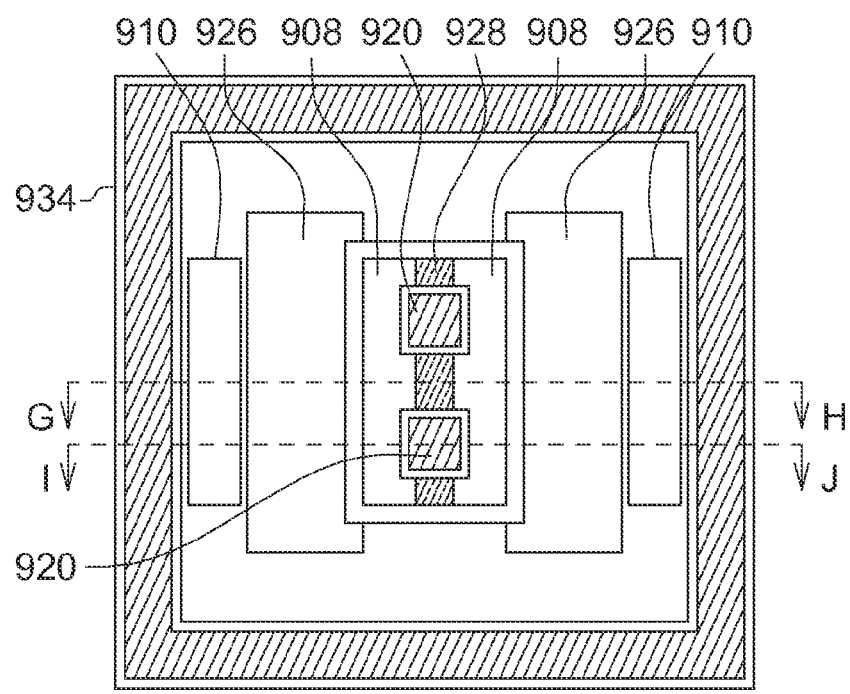
FIG. 16 shows a top view of the semiconductor structure in one embodiment.
Figure 17:
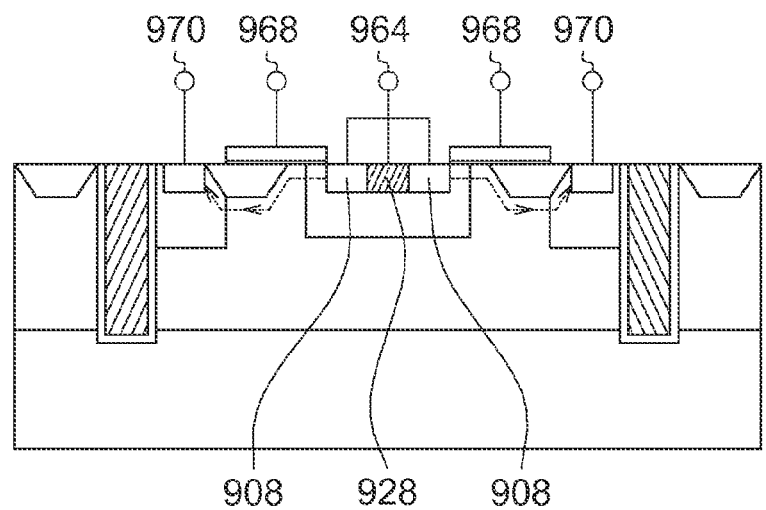
FIG. 17 shows a cross-section view of the semiconductor structure in one embodiment.
Figure 18:
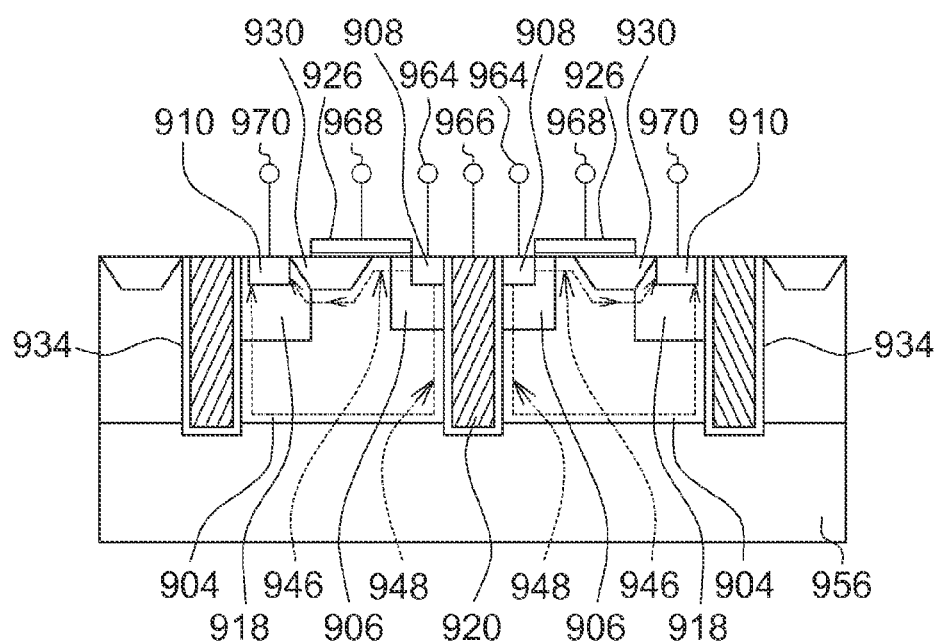
FIG. 18 shows a cross-section view of the semiconductor structure in one embodiment.

FIG. 16 shows a top view of the semiconductor structure in one embodiment. FIG. 17 and FIG. 18 are cross-section views of the semiconductor structure drawn respectively along GH line and IJ line in FIG. 16. Referring to FIG. 18, the first gate structure 920 is electrically connected to a bias 966 such as gate bias. The third doped region 908 is electrically connected to a bias 964 such as source bias. The second gate structure 926 is electrically connected to a bias 968 such as gate bias. The fourth doped region 910 is electrically connected to a bias 970 such as drain bias. In one embodiment, the first doped region 904 having the first conductivity type such as N conductivity type is formed on the bottom layer 956 having the second conductivity type such as P conductivity type by an epitaxy growth method. Referring to FIG. 17, the fifth doped region 928 between the third doped regions 908 is also electrically connected to the bias 964. Referring to FIG. 16, the second trench structure 934 having isolation effect has a ring shape for defining the active region of the semiconductor structure, decreasing the design area efficiently. The dielectric structure 930 comprises STI.

In embodiments, the method for operating the semiconductor structure comprises following steps. A current is driven between the third doped region 908 and the fourth doped region 910 by applying the bias 964 and the bias 970. The first channel 948 adjacent to the first gate structure 920 is controlled to be in on-state or off-state by applying the bias 966 to the first gate structure 920. The second channel 946 adjacent to the second gate structure 926 is controlled to be in on-state or off-state by applying the bias 968 to the second gate structure 926. For example, as the semiconductor structure is in on-state, the current flows from the third doped region 908, through the second channel 946, the first doped region 904, and the well region 918, to the fourth doped region 910. The current also flows from the third doped region 908, through the first channel 948, the first doped region 904, and the well region 918, to the fourth doped region 910. Therefore, the semiconductor structure using the dual-gate concept has a high on-state current and a low on-state resistance (Rdson).

In some embodiments, the semiconductor structure as shown in FIG. 18 comprises LDMOS or EDMOS. The first doped region 904, the well region 918, the fourth doped region 910, the third doped region 908 have the first conductivity type such as N conductivity type. The bottom layer 956, the second doped region 906 and the fifth doped region 928 (FIG. 17) have the second conductivity type such as P conductivity type opposite to the first conductivity type.

Figure 19:
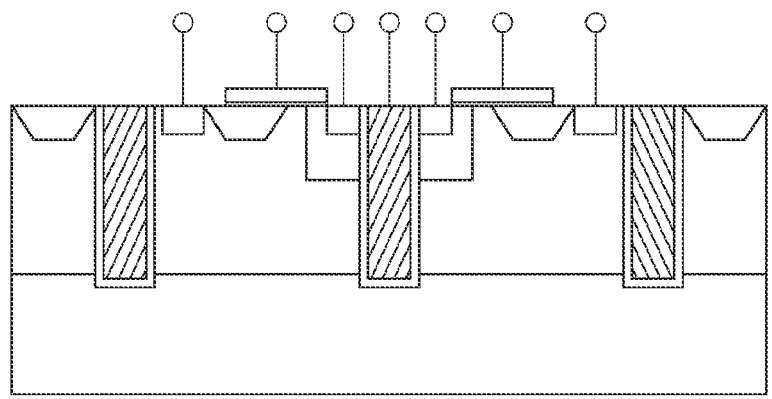
FIG. 19 shows a cross-section view of the semiconductor structure in one embodiment.

In some embodiments, the semiconductor structure as shown in FIG. 18 comprises IGBT. The first doped region 904 and the third doped region 908 have the first conductivity type such as N conductivity type. The bottom layer 956, the second doped region 906, the fifth doped region 928 (FIG. 17), the well region 918 and the fourth doped region 910 have the second conductivity type such as P conductivity type opposite to the first conductivity type. In other embodiments, the semiconductor structure comprising IGBT has the well region 918 of, for example, N conductivity type. In some embodiments, the well region 918 is omitted in the semiconductor structure as shown in FIG. 19.

Figure 20:
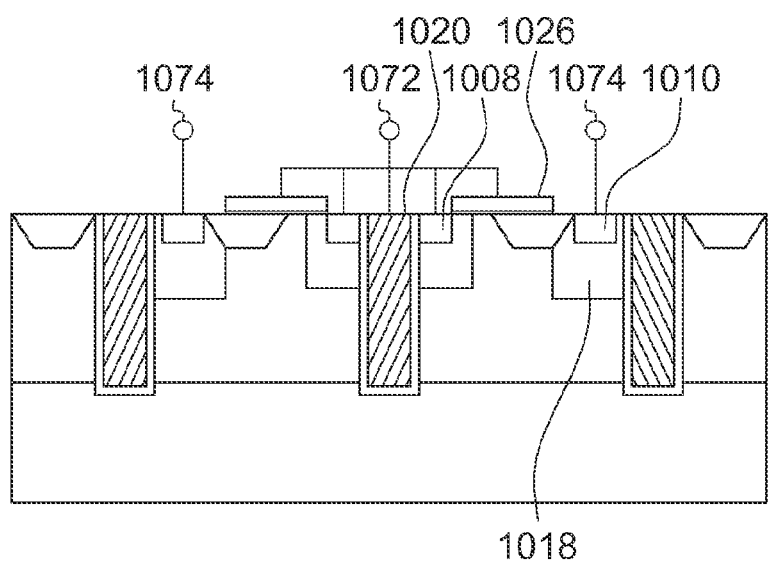
FIG. 20 shows a cross-section view of the semiconductor structure in one embodiment.
Figure 21:
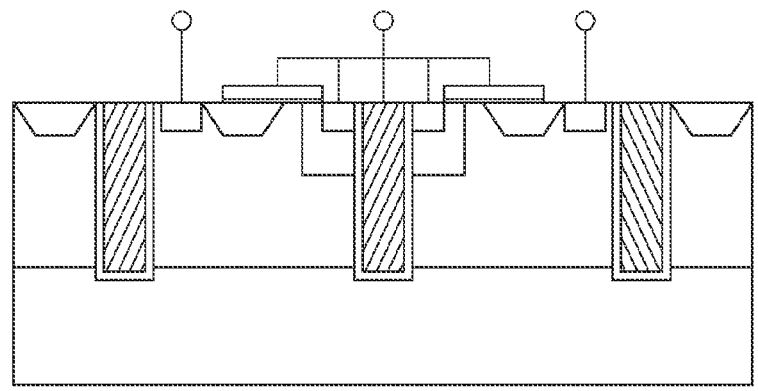
FIG. 21 shows a cross-section view of the semiconductor structure in one embodiment.

In some embodiments, the semiconductor structure comprises diode, as shown in FIG. 20. The semiconductor structure shown in FIG. 20 differs from the semiconductor structure shown in FIG. 18 in that the first gate structure 1020, the third doped region 1008 and the second gate structure 1026 are electrically connected to the bias 1072 such as low voltage. The fourth doped region 1010 is electrically connected to the bias 1074 such as high voltage. In some embodiments, the well region 1018 is omitted in the semiconductor structure, as shown in FIG. 21.

Figure 22:
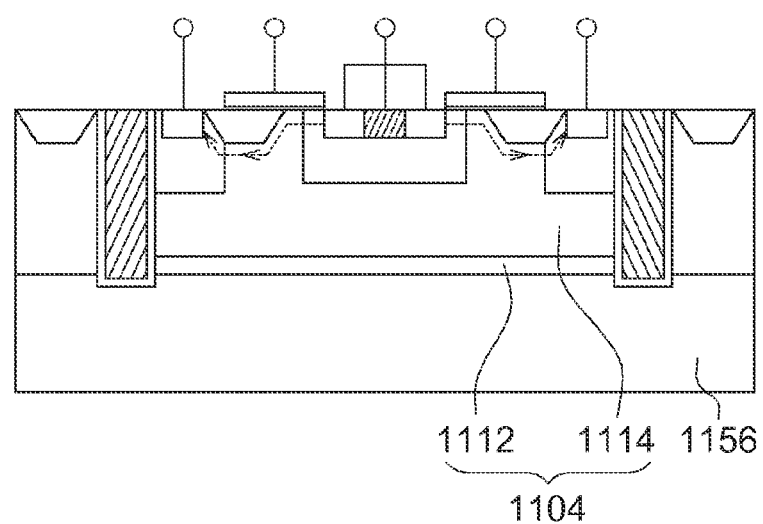
FIG. 22 shows a cross-section view of the semiconductor structure in one embodiment.
Figure 23:
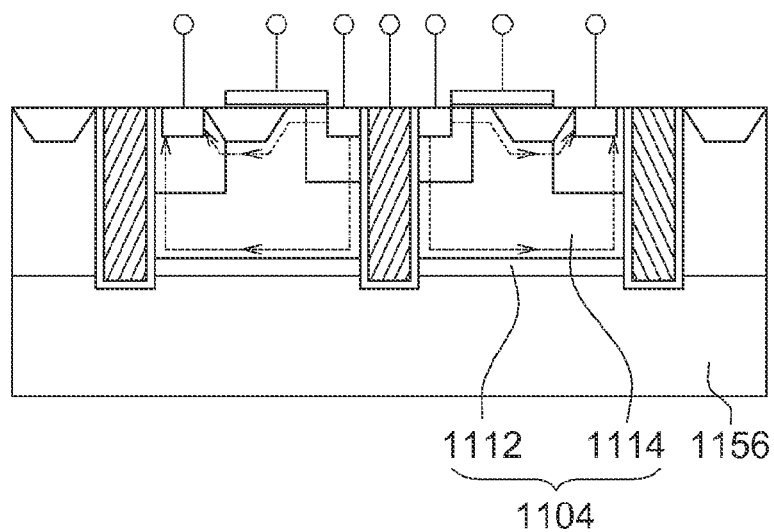
FIG. 23 shows a cross-section view of the semiconductor structure in one embodiment.

FIG. 22 and FIG. 23 show a cross-section view of the semiconductor structure in one embodiment. FIG. 22 and FIG. 23 are cross-section views of the semiconductor structure, for example, drawn respectively along GH line and IJ line in FIG. 16. The semiconductor structure shown in FIG. 22 and FIG. 23 differs from the semiconductor structure shown in FIG. 17 and FIG. 18 in that the first doped region 1104 having the first conductivity type such as N conductivity type comprises the sub-doped layer 1112 and the sub-doped layer 1114. In one embodiment, the sub-doped layer 1112 is formed on the bottom layer 1156 having the second conductivity type such as P conductivity type by an epitaxy growth method. In other embodiments, the sub-doped layer 1112 and the bottom layer 1156 have the same second conductivity type such as P conductivity type. In this example, the sub-doped layer 1112 is regarded as a part of the bottom layer 1156.

Figure 24:
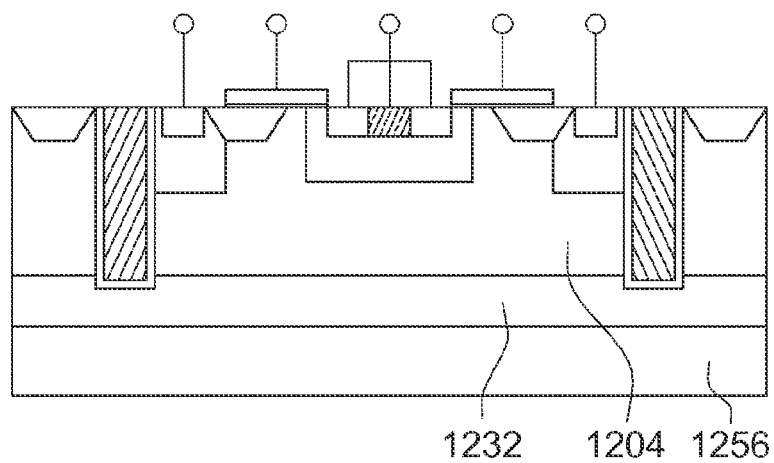
FIG. 24 shows a cross-section view of the semiconductor structure in one embodiment.
Figure 25:
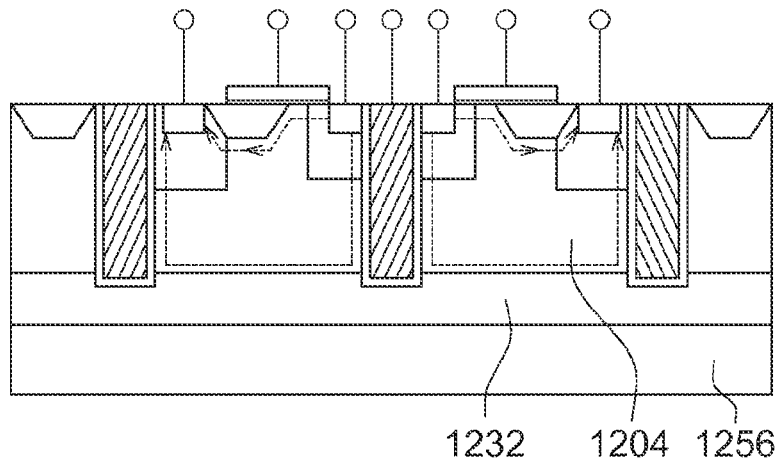
FIG. 25 shows a cross-section view of the semiconductor structure in one embodiment.

FIG. 24 and FIG. 25 are cross-section views of the semiconductor structure, for example, drawn respectively along GH line and IJ line in FIG. 16. The semiconductor structure shown in FIG. 24 and FIG. 25 differs from the semiconductor structure shown in FIG. 17 and FIG. 18 in that the buried dielectric layer 1232 is between the first doped region 1204 and the bottom layer 1256. The buried dielectric layer 1232 comprises oxide. In one embodiment, the first doped region 1204 is formed by an epitaxy method.

Figure 26:
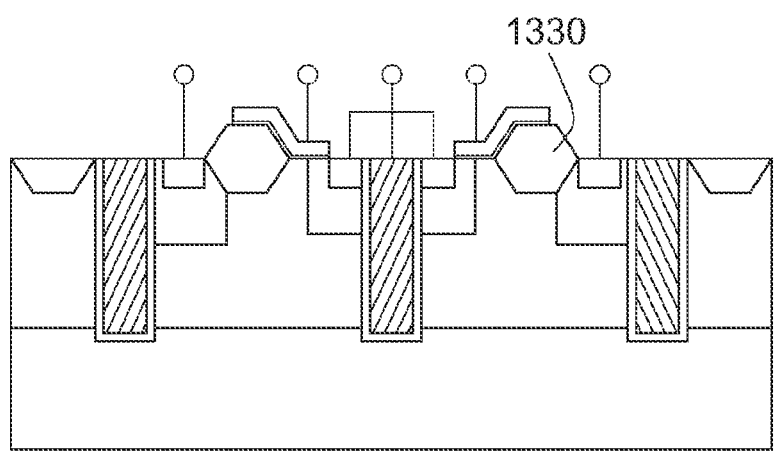
FIG. 26 shows a cross-section view of the semiconductor structure in one embodiment.
Figure 27:
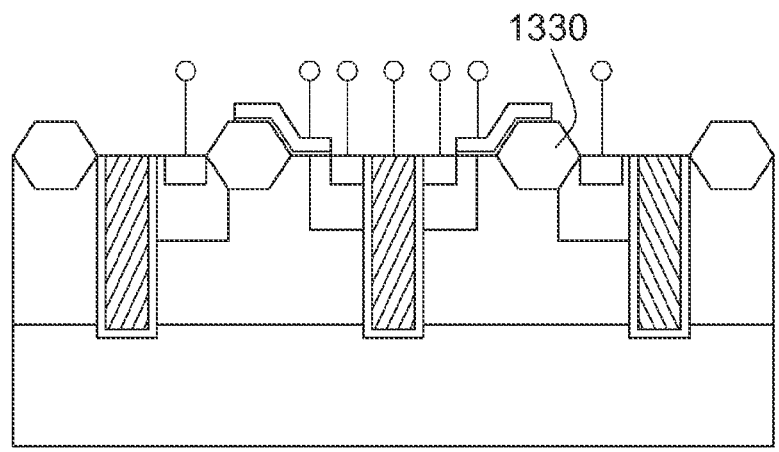
FIG. 27 shows a cross-section view of the semiconductor structure in one embodiment.

FIG. 26 and FIG. 27 show a cross-section view of the semiconductor structure in one embodiment. FIG. 26 and FIG. 27 are cross-section views of the semiconductor structure, for example, drawn respectively along GH line and IJ line in FIG. 16. The semiconductor structure shown in FIG. 26 and FIG. 27 differs from the semiconductor structure shown in FIG. 17 and FIG. 18 in that the dielectric structure 1330 is FOX.

Figure 28:
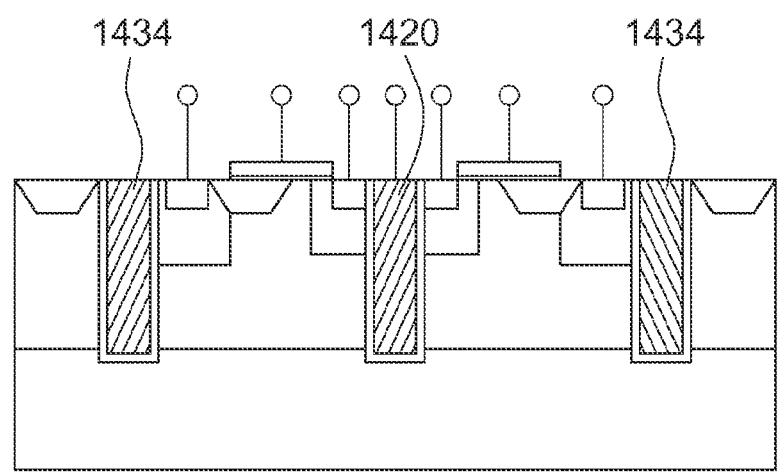
FIG. 28 shows a cross-section view of the semiconductor structure in one embodiment.
Figure 29:
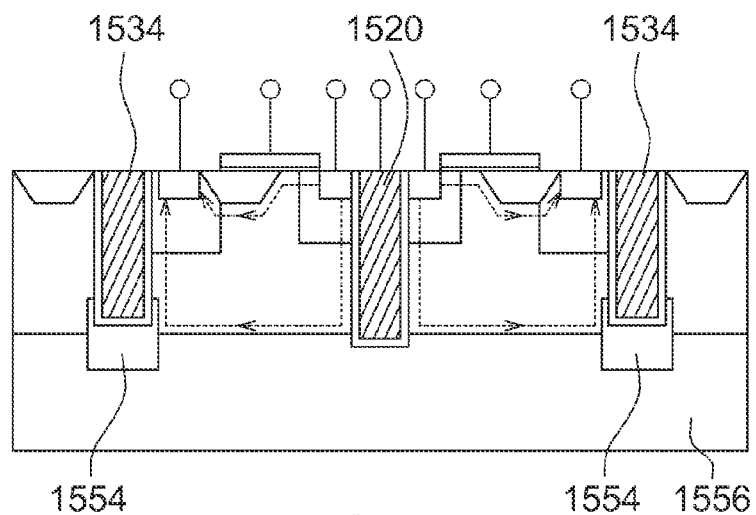
FIG. 29 shows a cross-section view of the semiconductor structure in one embodiment.

In one embodiment, the first gate structure 920 and the second trench structure 934 shown in FIG. 18 are elongated according to demand as the first gate structure 1420 and the second trench structure 1434 as shown in FIG. 28. In other embodiments, the first gate structure 920 and the second trench structure 934 shown in FIG. 18 are shortened according to demand as the first gate structure 1520 and the second trench structure 1534 as shown in FIG. 29. Referring to FIG. 29, the doped region 1554 is formed between the second trench structure 1534 and the bottom layer 1556.

Figure 30:
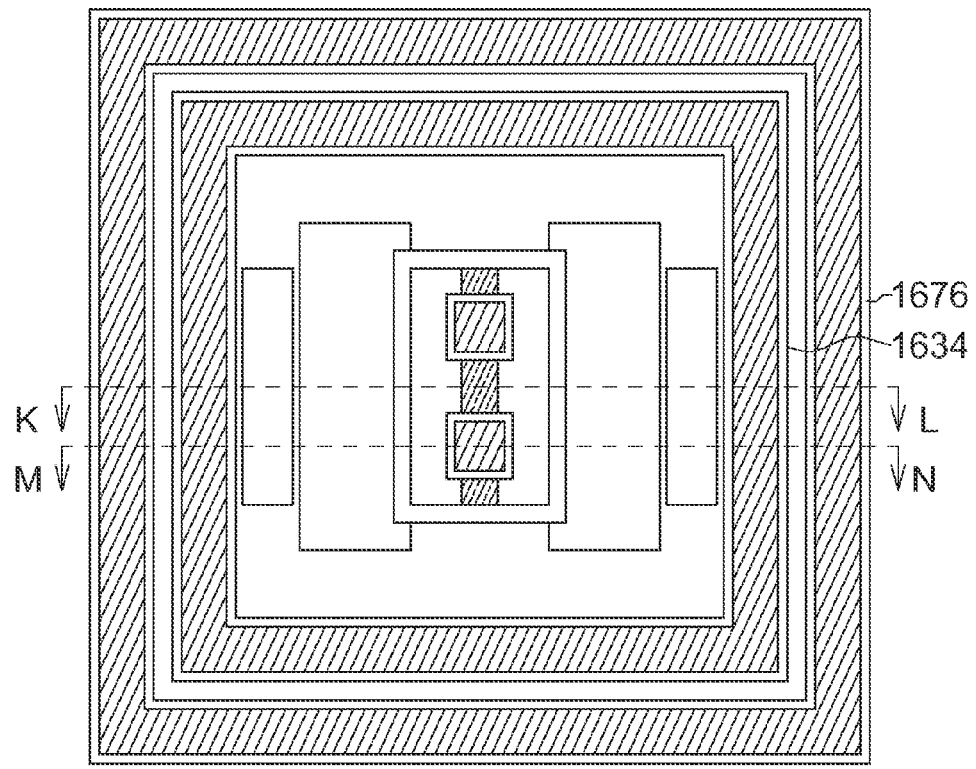
FIG. 30 shows a top view of the semiconductor structure in one embodiment.
Figure 31:
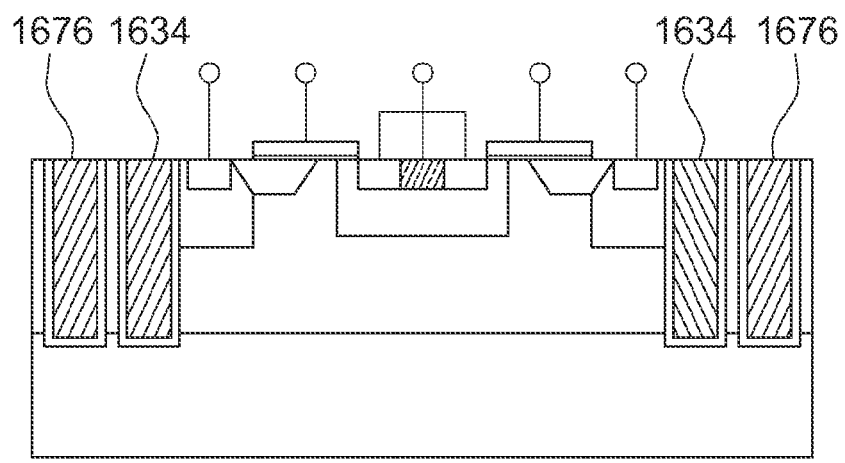
FIG. 31 shows a cross-section view of the semiconductor structure in one embodiment.
Figure 32:
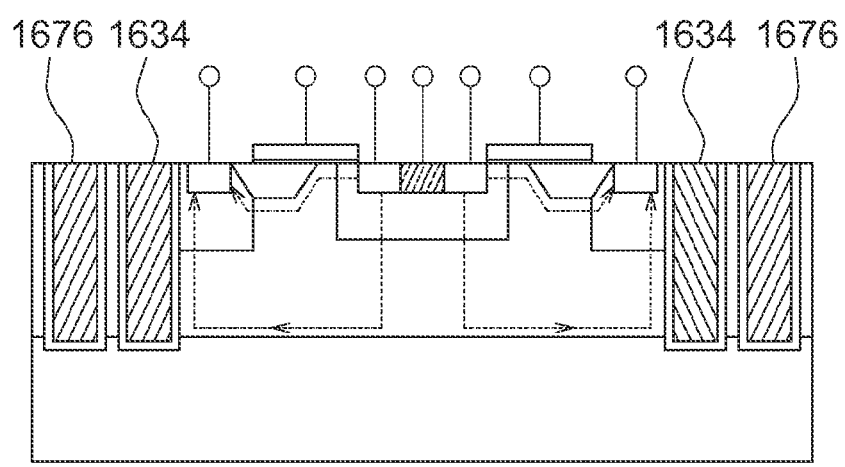
FIG. 32 shows a cross-section view of the semiconductor structure in one embodiment.

FIG. 30 shows a top view of the semiconductor structure in one embodiment. FIG. 31 and FIG. 32 are cross-section views of the semiconductor structure drawn respectively along KL line and MN line in FIG. 30. The semiconductor structure shown in FIGS. 30, 31 and 32 differs from the semiconductor structure shown in FIGS. 16, 17 and 18 in that a third trench structure 1676 is disposed at the outside of the second trench structure 1634.

Figure 33:
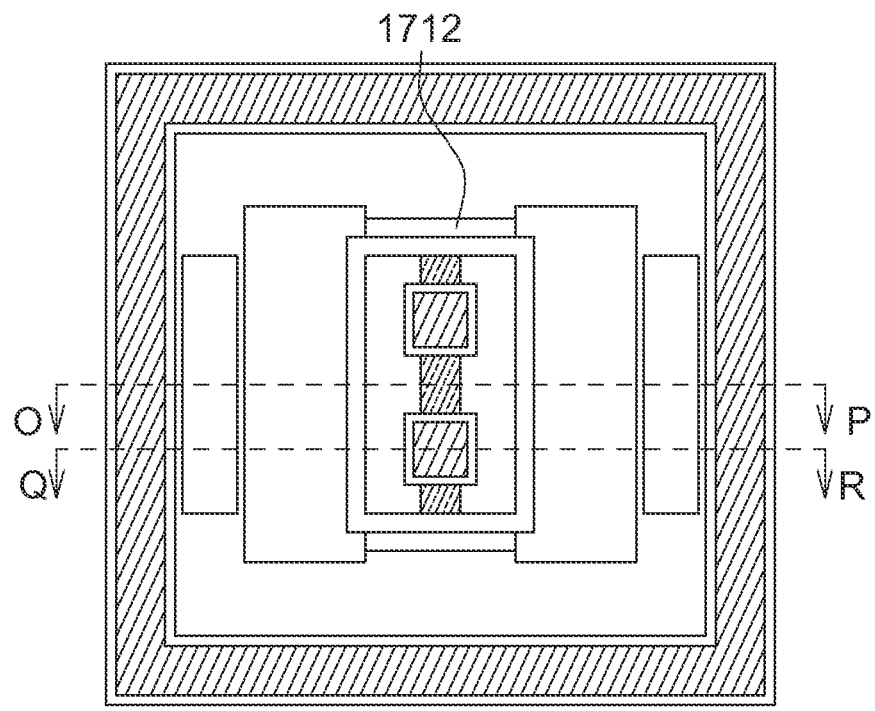
FIG. 33 shows a top view of the semiconductor structure in one embodiment.
Figure 34:
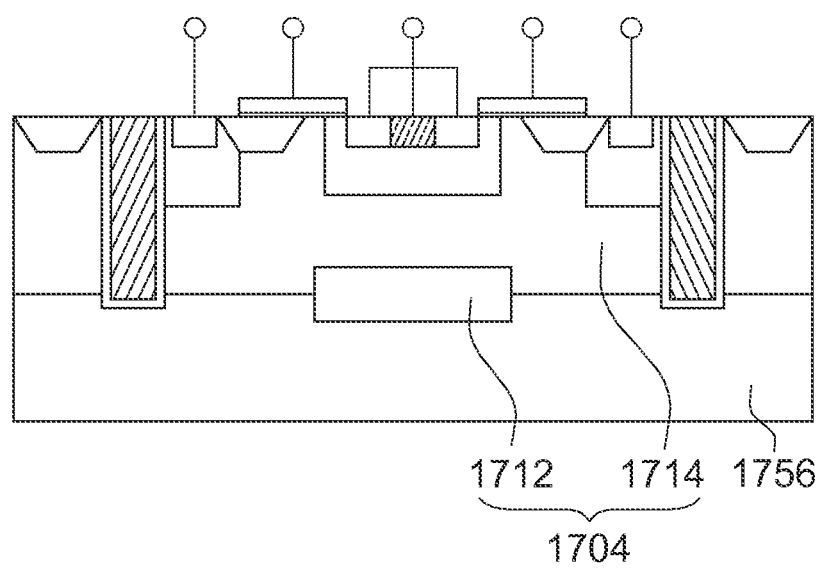
FIG. 34 shows a cross-section view of the semiconductor structure in one embodiment.
Figure 35:
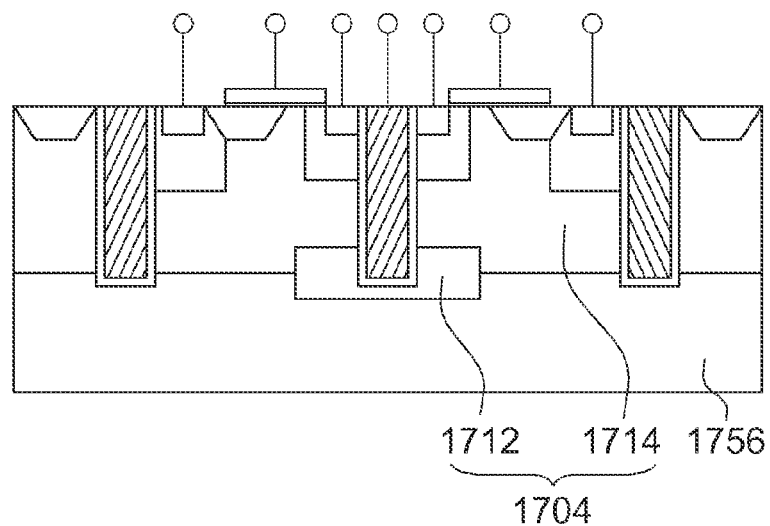
FIG. 35 shows a cross-section view of the semiconductor structure in one embodiment.

FIG. 33 shows a top view of the semiconductor structure in one embodiment. FIG. 34 and FIG. 35 are cross-section views of the semiconductor structure drawn respectively along OP line and QR line in FIG. 33. The semiconductor structure shown in FIGS. 33, 34 and 35 differs from the semiconductor structure shown in FIGS. 16, 17 and 18 in that the first doped region 1704 having the first conductivity type such as N conductivity type comprises the sub-doped layer 1712 and the sub-doped layer 1714. In one embodiment, the sub-doped layer 1714 is formed on the bottom layer 1756 having the second conductivity type such as P conductivity type by an epitaxy growth method.

Figure 36:
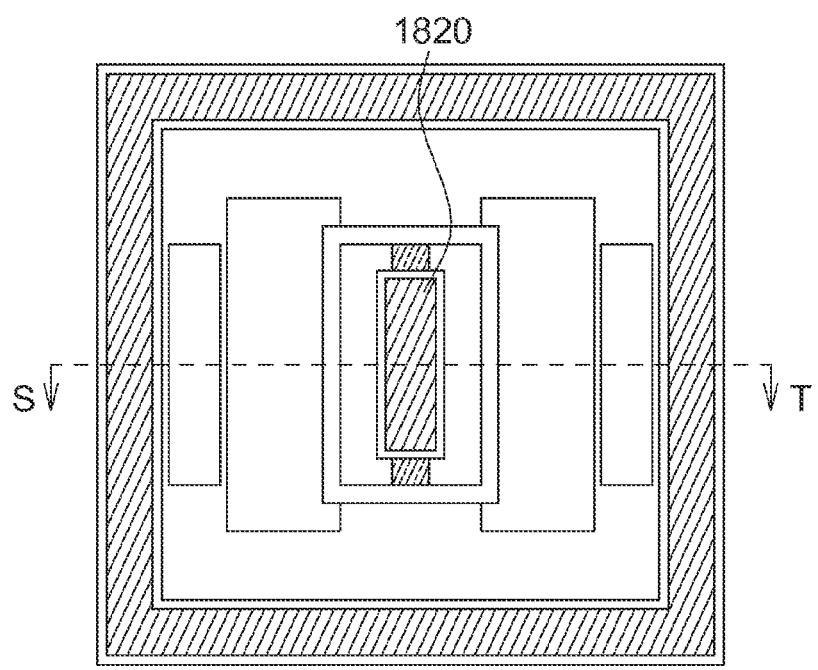
FIG. 36 shows a top view of the semiconductor structure in one embodiment.

FIG. 36 shows a top view of the semiconductor structure in one embodiment. The semiconductor structure shown in FIG. 36 differs from the semiconductor structure shown in FIG. 16 in that the first gate structure 1820 is formed. A cross-section view of the semiconductor structure drawn along ST line may be similar to FIG. 18.

Figure 37:
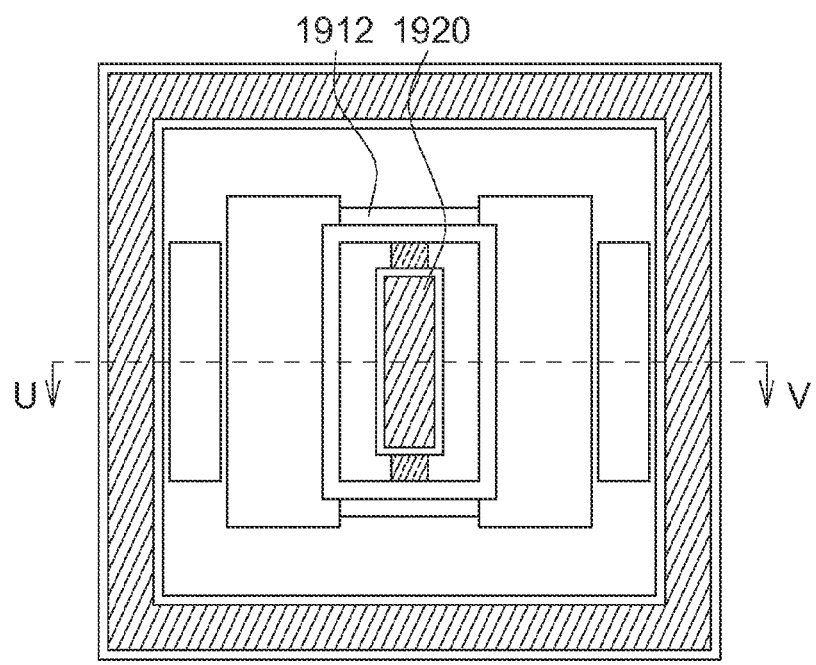
FIG. 37 shows a top view of the semiconductor structure in one embodiment.
Figure 38:
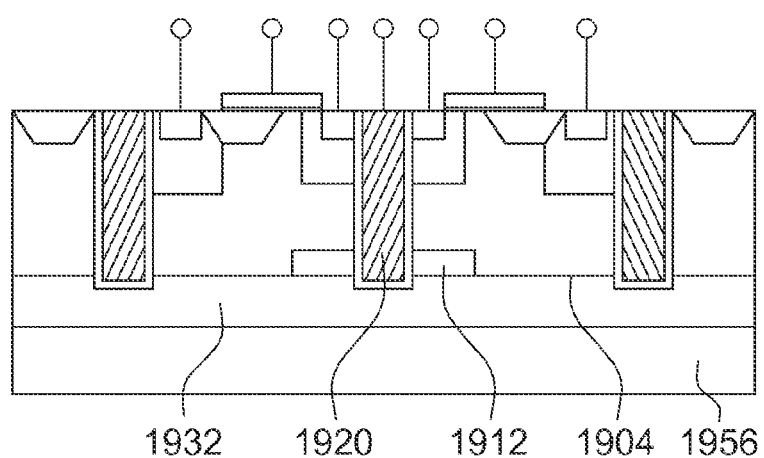
FIG. 38 shows a cross-section view of the semiconductor structure in one embodiment.

FIG. 37 shows a top view of the semiconductor structure in one embodiment. The semiconductor structure shown in FIG. 37 differs from the semiconductor structure shown in FIG. 33 in that the first gate structure 1920 is formed. FIG. 38 is a cross-section view of the semiconductor structure drawn along UV line in FIG. 37. The semiconductor structure shown in FIG. 38 differs from the semiconductor structure shown in FIG. 35 in that the buried dielectric layer 1932 is between the bottom layer 1956 and the sub-doped layer 1912 of the first doped region. A cross-section view of the semiconductor structure drawn along UV line in FIG. 37 may be similar to FIG. 35.

Figure 39:
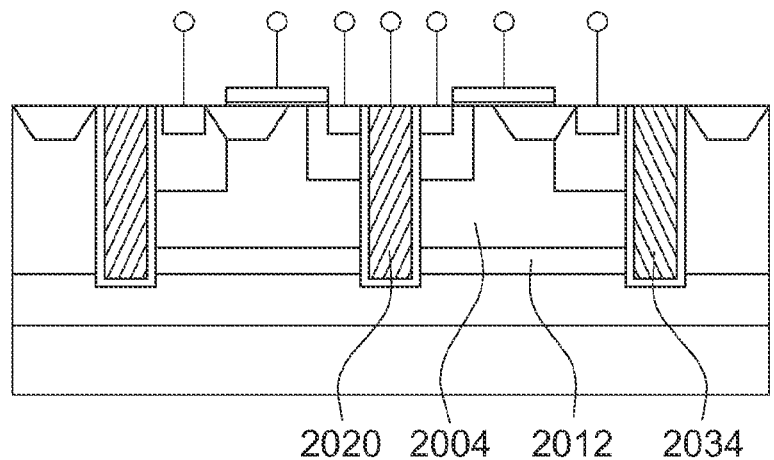
FIG. 39 shows a cross-section view of the semiconductor structure in one embodiment.

FIG. 39 shows a cross-section view of the semiconductor structure in one embodiment. The semiconductor structure shown in FIG. 39 differs from the semiconductor structure shown in FIG. 38 in that the sub-doped layer 2012 of the first doped region 2004 is extended between the first gate structure 2020 and the second trench structure 2034.

Figure 40:
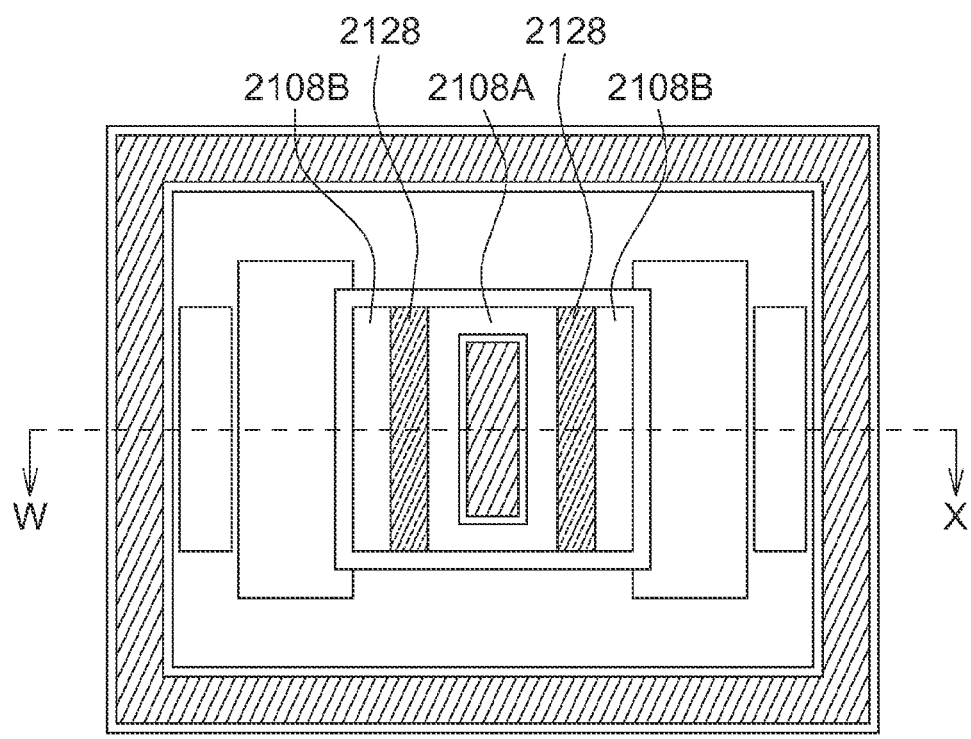
FIG. 40 shows a top view of the semiconductor structure in one embodiment.
Figure 41:
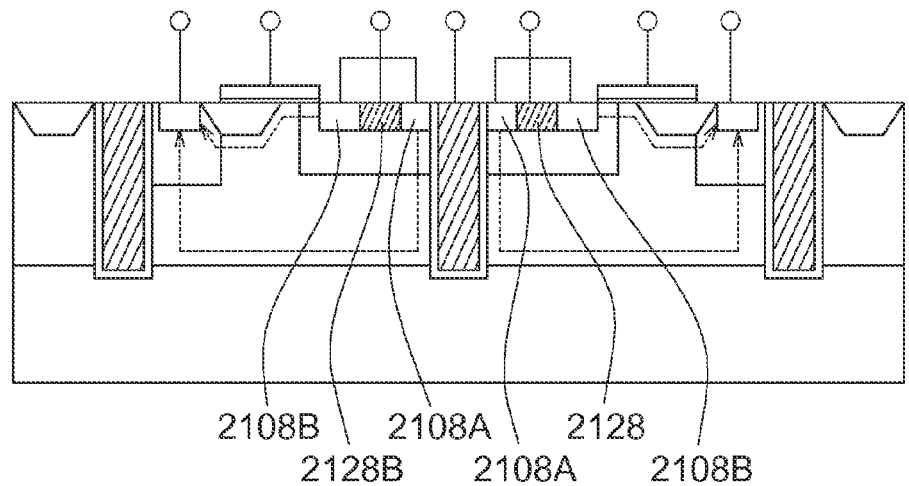
FIG. 41 shows a cross-section view of the semiconductor structure in one embodiment.

FIG. 40 shows a top view of the semiconductor structure in one embodiment. FIG. 41 is a cross-section view of the semiconductor structure drawn along WX line in FIG. 40. The semiconductor structure shown in FIGS. 40 and 41 differs from the semiconductor structure shown in FIGS. 16 and 18 in that the fifth doped region 2128 is disposed between the third doped region 2108A and the third doped region 2108B.

Figure 42:
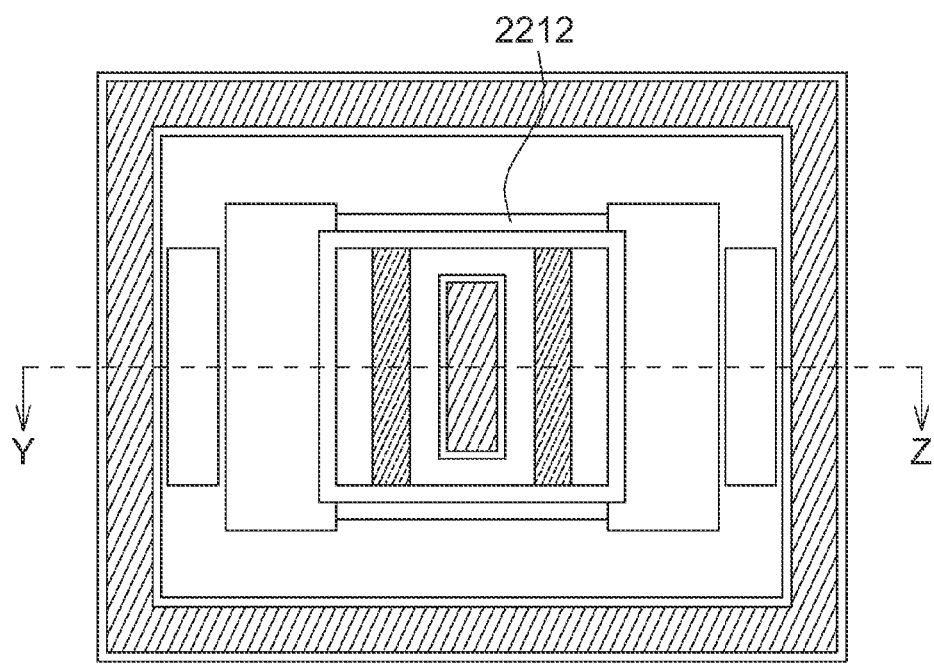
FIG. 42 shows a top view of the semiconductor structure in one embodiment.
Figure 43:
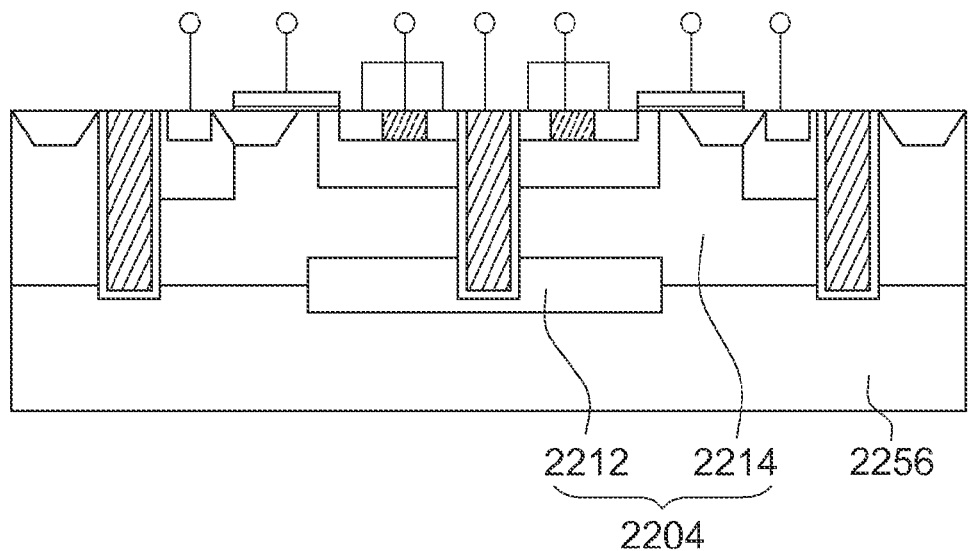
FIG. 43 shows a cross-section view of the semiconductor structure in one embodiment.

FIG. 42 shows a top view of the semiconductor structure in one embodiment. FIG. 43 is a cross-section view of the semiconductor structure drawn along YZ line in FIG. 42. The semiconductor structure shown in FIGS. 42 and 43 differs from the semiconductor structure shown in FIGS. 40 and 41 in that the first doped region 2204 having the first conductivity type such as N conductivity type comprises the sub-doped layer 2212 and the sub-doped layer 2214. In one embodiment, the sub-doped layer 2214 is formed on the bottom layer 2256 having the second conductivity type such as P conductivity type by an epitaxy growth method.

Figure 44:
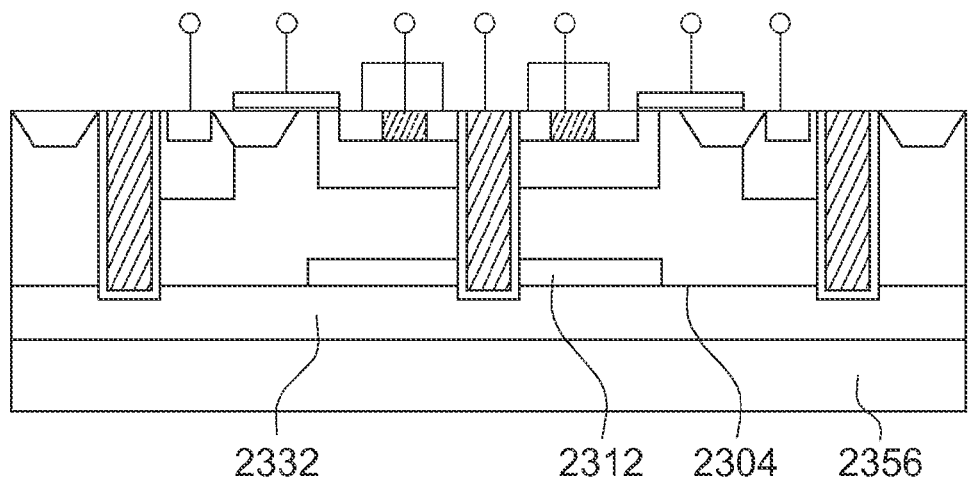
FIG. 44 shows a cross-section view of the semiconductor structure in one embodiment.

FIG. 44 shows a cross-section view of the semiconductor structure in one embodiment. The semiconductor structure shown in FIG. 44 differs from the semiconductor structure shown in FIG. 43 in that the buried dielectric layer 2332 is between the bottom layer 2356 and the sub-doped layer 2312 of the first doped region 2304.

Figure 45:
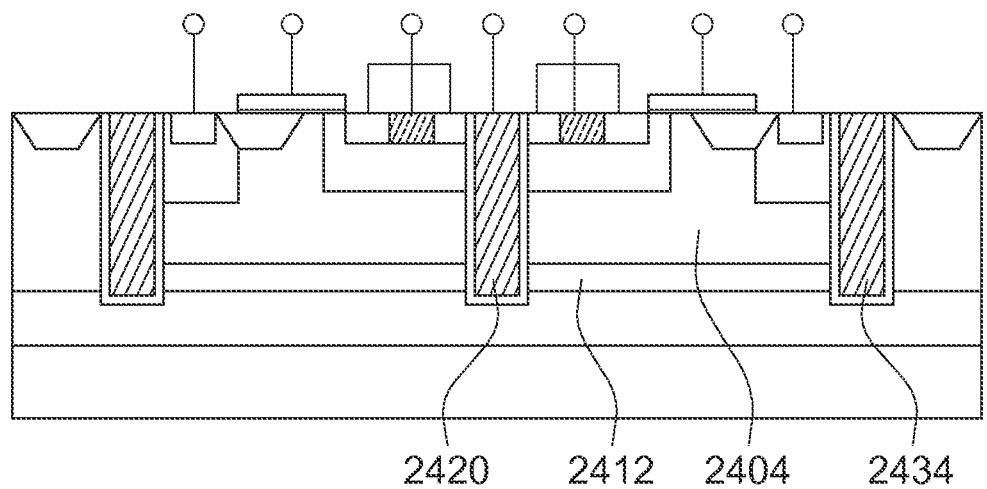
FIG. 45 shows a cross-section view of the semiconductor structure in one embodiment.

FIG. 45 shows a cross-section view of the semiconductor structure in one embodiment. The semiconductor structure shown in FIG. 45 differs from the semiconductor structure shown in FIG. 44 in that the sub-doped layer 2412 of the first doped region 2404 is extended between the first gate structure 2420 and the second trench structure 2434.

In embodiments in the present disclosure, the semiconductor structure uses the dual-gate concept. The super junction concept may be also used in the semiconductor structure. Therefore, the breakdown voltage and the on-state resistance (on-state current) are both improved. The semiconductor structure has a high breakdown voltage and a small design area by using the second trench structure having isolation effect. A dopant concentration of a portion of the sub-doped layer, used as a buried doped layer, of the first doped region adjacent to the first trench structure having the first gate structure is smaller than a dopant concentration of a portion of the sub-doped layer far from the first trench structure. Thus, the conductivity efficiency of the current flowing the long path comprising the first channel is improved. The on-state current is increased and the on-state resistance of the semiconductor structure is decreased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a substrate;
a first doped region in the substrate, wherein the first doped region has a first conductivity type, the first doped region comprises:
a sub-doped layer having the first conductivity type; and
a buried doped layer under the sub-doped layer and having the first conductivity type;
a second doped region in the sub-doped layer, wherein the second doped region has a second conductivity type opposite to the first conductivity type;
a third doped region in the second doped region and having the first conductivity type;
a buried doped region on a sidewall of the buried doped layer and having the second conductivity type;
a first trench structure having a first gate structure; and
a second trench structure, wherein the first gate structure and the second trench structure are respectively on different sides of the second doped region, a dopant concentration of a first portion of the buried doped layer adjacent to the first trench structure is smaller than a dopant concentration of a second portion of the buried doped layer far from the first trench structure, the first trench structure is extended into the first portion of the buried doped layer, the second trench structure is extended into the buried doped region adjacent to the second portion of the buried doped layer.

2. The semiconductor structure according to claim 1, further comprising a fourth doped region, wherein the second doped region and the fourth doped region are separated by the first doped region.

3. The semiconductor structure according to claim 1, wherein the first gate structure comprises a gate dielectric layer and a gate electrode layer, the gate electrode layer is separated from the first doped region and the second doped region by the gate dielectric layer.

4. The semiconductor structure according to claim 1, further comprising a second gate structure on the substrate between the first trench structure and the second trench structure, the second trench structure has a ring shape.

5. The semiconductor structure according to claim 1, further comprising a dielectric structure between the second gate structure and the first doped region.

6. The semiconductor structure according to claim 1, further comprising a bottom layer having the second conductivity type and under the first doped region.

7. The semiconductor structure according to claim 1, wherein a height of the second portion of the buried doped layer adjacent to the second trench structure is bigger than a height of the first portion of the buried doped layer far from the second trench structure.

8. The semiconductor structure according to claim 7, wherein the height of the buried doped layer becomes small in a direction away from the second trench structure.

9. The semiconductor structure according to claim 1, further comprising a fifth doped region having the second conductivity type and in the second doped region.

10. The semiconductor structure according to claim 1, further comprising sixth doped regions having the second conductivity type and separated from each other by the first doped region.

11. The semiconductor structure according to claim 10, wherein the sixth doped regions and a portion of the first doped region separating the sixth doped regions form a super junction structure.

12. The semiconductor structure according to claim 10, wherein the sixth doped regions each has a rectangular shape or honeycomb shape.

13. A method for operating a semiconductor structure, wherein the semiconductor structure comprises:
- a substrate;
- a first doped region in the substrate, wherein the first doped region has a first conductivity type, the first doped region comprises:
- a sub-doped layer having the first conductivity type; and
- a buried doped layer under the sub-doped layer and having the first conductivity type;
- a second doped region in the sub-doped layer, wherein the second doped region has a second conductivity type opposite to the first conductivity type;
- a third doped region in the second doped region and having the first conductivity type;
- a buried doped region on a sidewall of the buried doped layer and having the second conductivity type;
- a first trench structure having a first gate structure;
- a second trench structure; and
- a second gate structure, wherein the first gate structure and the second trench structure are respectively on different sides of the second doped region, a dopant concentration of a first portion of the buried doped layer adjacent to the first trench structure is smaller than a dopant concentration of a second portion of the buried doped layer far from the first trench structure, the first trench structure is extended into the first portion of the buried doped layer, the second trench structure is extended into the buried doped region adjacent to the second portion of the buried doped layer, the operating method comprising:
applying a first bias between the third doped region and the first doped region respectively on opposite sides of the second gate structure; and
applying a second bias to the first gate structure and applying a third bias to the second gate structure to controlling the semiconductor to be in on-state or off-state, wherein as the semiconductor structure is in on-state, a current flows through a channel at least comprising:
- a first channel comprising a portion of the second doped region adjacent to the first gate structure; and
- a second channel comprising a portion of the second doped region adjacent to the second gate structure.

14. The method for operating the semiconductor structure according to claim 13, wherein as the semiconductor structure is in on-state, the current flows between the third doped region and the first doped region respectively on opposite sides of the second gate structure.

* * * * *